United States Patent [19]

Varrasso et al.

[11] 4,063,027
[45] Dec. 13, 1977

[54] METHOD OF AND APPARATUS FOR MONITORING FOR ELECTRODE DISPLACEMENT IN THE JOULE EFFECT HEATING OF HEAT SOFTENABLE MATERIAL

[75] Inventors: Eugene C. Varrasso; John F. Maddux, both of Heath, Ohio

[73] Assignee: Owens-Corning Fiberglas Corporation, Toledo, Ohio

[21] Appl. No.: 702,543

[22] Filed: July 6, 1976

Related U.S. Application Data

[63] Continuation-in-part of Ser. No. 630,841, Nov. 10, 1975, Pat. No. 3,984,611, which is a continuation of Ser. No. 514,549, Oct. 15, 1974, abandoned.

[51] Int. Cl.² .............................................. C03B 5/02
[52] U.S. Cl. ................................................ 13/6
[58] Field of Search .................................. 13/6, 23, 24

[56] References Cited

U.S. PATENT DOCUMENTS

| | | | |
|---|---|---|---|
| 3,634,588 | 1/1972 | Steitz et al. | 13/6 |
| 3,984,611 | 10/1976 | Varrasso et al. | 13/6 |

*Primary Examiner*—R. N. Envall, Jr.
*Attorney, Agent, or Firm*—Ronald C. Hudgens; Charles F. Schroeder

[57] ABSTRACT

A method of detecting electrode displacement in an opaque melt of heat softenable material heated by Joule effect through said electrode by monitoring the current, voltage and electrical displacement characteristics of a body of heat softenable material and the electrodes. A relatively rapid change in monitored resistance is an indication of and often characteristic of given changes in the geometric relationships between an electrode the heat softenable material and other electrodes which can accelerate the failure of a system if corrective action is not taken. Alarm indicators, instruction print out, and/or process controls can be actuated in response to a given current voltage or resistance change. Slumping of electrodes and the direction of the slumping is indicated by the nature and magnitude of changes detected on a long term basis at least of the order of days in length. Plural electrodes and electrode pairs are monitored by multiplexing to provide a repetitive cyclic scan of the parameters between pairs. Distortion of current and voltage values is minimized, where selective portions of regular power pulses are gated for control of heating, and complex waveforms result by employing true r.m.s. values of current and voltage developed in true r.m.s. to d.c. converters. An approximation circuit for producing a d.c. voltage which is approximately proportional to the r.m.s. values of current and voltage resulting from phase controlled firing of controlled rectifiers into the electrode melt load.

13 Claims, 9 Drawing Figures

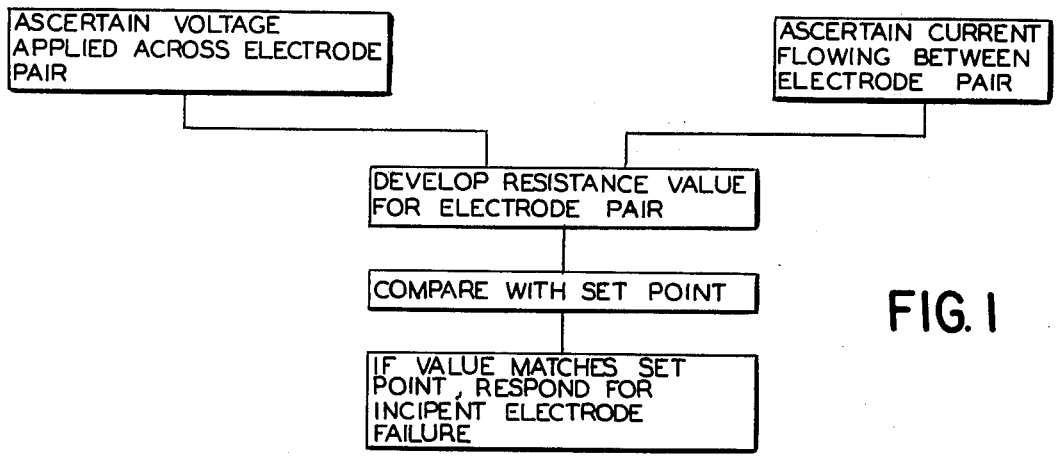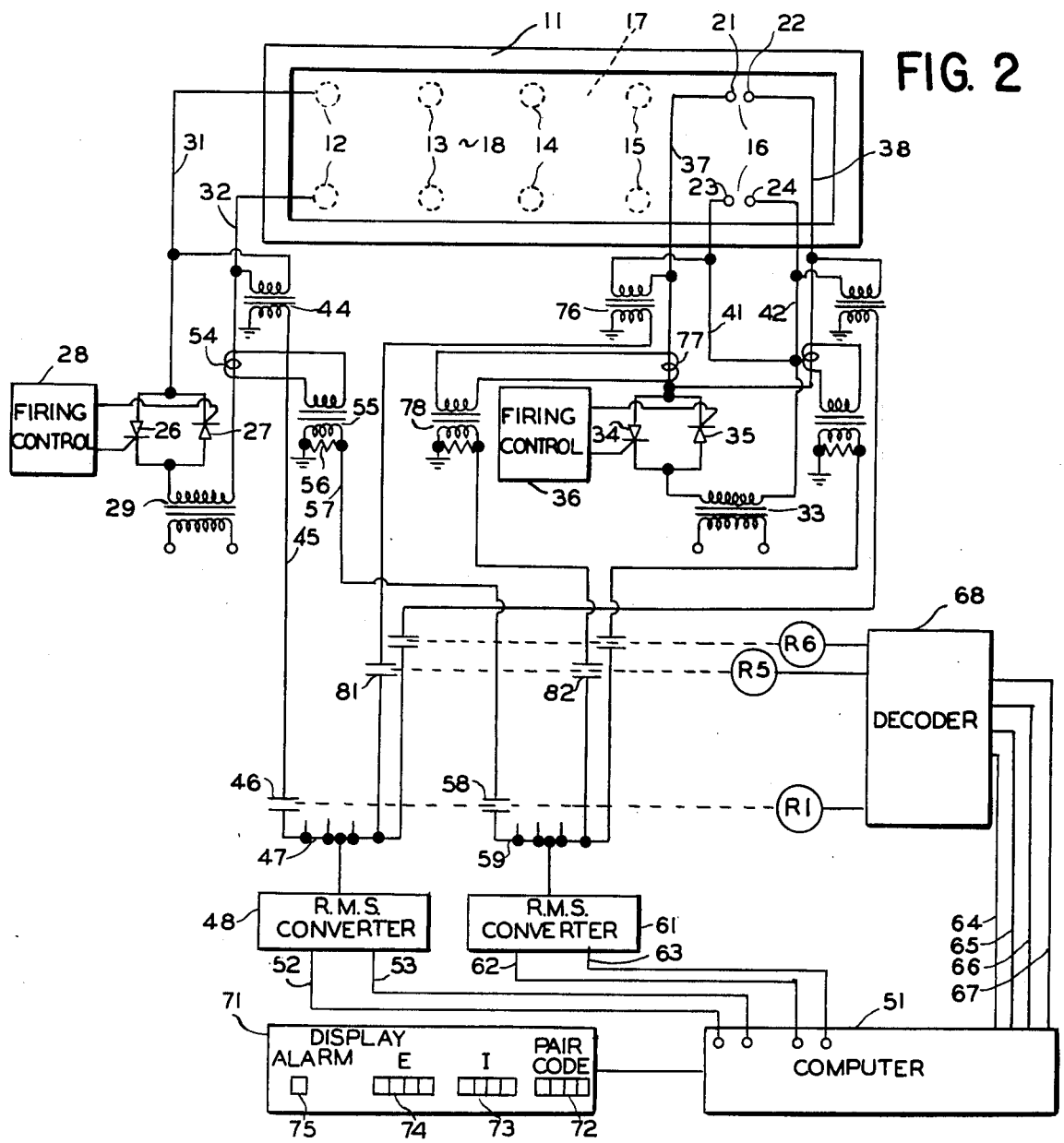

METHOD OF AND APPARATUS FOR MONITORING FOR ELECTRODE DISPLACEMENT IN THE JOULE EFFECT HEATING OF HEAT SOFTENABLE MATERIAL

RELATED PATENT APPLICATIONS

This application is a continuation-in-part of Eugene C. Varrasso U.S. patent application Ser. No. 630,841 filed Nov. 10, 1975, now U.S. Pat. No. 3,984,611 which issued Oct. 5, 1976, which is a continuation of Eugene C. Varrasso, U.S. patent application Ser. No. 514,549 which was filed Oct. 15, 1974, now abandoned.

BACKGROUND OF THE INVENTION

1. Field of the Invention

This invention relates to the monitoring of processing apparatus and more particularly to methods of and apparatus for monitoring for conditions indicative of displacement of an electrode in a molten body of heat softenable material and of incipient electrode or refractory wall failure in a heating and melting apparatus for Joule effect heated heat softenable material.

2. Description of the Prior Art

The electrical heating of heat softenable materials by Joule effect involves establishing electrical current communication with the material through electrodes. A typical heat softenable material, glass, has been maintained at or above the usual working temperatures, about 2600° F, by immersing one or more pairs of electrodes in the molten glass and passing controlled pulses of electrical power from the electrodes through the glass. Frequently these electrodes have substantial portions of their glass contacting surfaces spaced from the walls of the container or furnace for the glass to reduce the heat imposed on those walls and extend wall life. One electrode form involves a right circular cylinder which is extended vetically through the bottom of the furnace. Although a number of expedients are employed to protect the electrode and the bottom refractory, it has been found that there is a tendency for electrodes to erode in the region of the wall through which they pass and to slump from a vertical orientation.

In the case of the cylindrical electrodes cooling jackets have been mounted around the electrodes beneath the furnace bottom to reduce the electrode temperature external of the furnace to a level at which it is not subject to attack by constituents of the atmosphere. Further, it is not uncommon to maintain an inert atmosphere within the jacket and around the electrode so it is protected in the portion of its length in which the temperature approaches that within the furnace. Even with such precautions electrodes tend to erode, usually in the region of and slightly below the furnace floor-molten glass interface. Such erosion can result in the breaking off of the electrode in the melt.

Upon breaking an electrode, the furnace wall in the vicinity of the remaining stub portion is attacked and will develop leaks unless corrective action is taken promptly.

In the aforenoted related applications changes in the cross sectional area of an electrode as by a necking down of the electrode and the creation of fractures in the necked region were taught to result in characteristic changes in the electrical parameters for the electrodes which could be monitored and, at threshold levels, actuate indicators.

Recently, it has been observed that Joule effect heated glass melting tanks can be punctured by the slumping of electrodes mounted to extend vertically through the furnace bottom. These punctures are attributed to electrical, physical and thermal erosion of the refractory furnace bottom wall by the slumped electrodes. The nature of the slumping influences the detrimental effects on the furnace operation since in some conditions adjacent electrodes can slump to produce an effective short circuit between them. It has also been observed that the electrodes which are continued in operation after they have slumped tend to be eroded to a cut-off state in the vicinity of the bend from the desired vertical orientation. thus it is desirable to detect the slumping of electrodes in the opaque mass of the thermally softenable material in order to establish corrective procedures or avoid the undesired consequences of continuing the mode of operation then in effect.

SUMMARY OF THE INVENTION

The present invention involves a method of and apparatus for monitoring apparatus for Joule effect heating molten materials to detect' incipient electrode failure conditions and electrode displacement from a preferred orientation and to indicate those conditions. Such indication enables corrective procedures to be timely undertaken.

An incipient electrode failure or electrode displacement from a preferred orientation has been found to be indicated by an increase in the resistance between an electrode pair supplying electrical power for Joule effect heating. Displacement of an electrode is distinguished from erosion or fracture by its rate and magnitude of increase from the initial values observed while it is in its preferred orientation. The resistance change may occur over weeks, months or even years of utilization.

One feature of the invention resides in sensing current and voltage in the circuit of an electrode pair to ascertain resistance and actuating an indicator in response to a predetermined resistance.

Another features involves enhancing the accuracy of the resistance ascertained by sensing the r.m.s. values of current and voltage and employing them to ascertain resistance.

A third feature resides in a circuit which can be employed with a comparator and which develops signal levels which represent values closely approximating true r.m.s. values of current and voltage for detecting the onset of critical current voltage ratio or resistance levels.

A fourth feature resides in a method of detecting displacement of an electrode immersed in a mass of heat softenable material from a preferred orientation by the sensing of the change in current-voltage ratio of an electrode pair including the electrode from the current-voltage ratio of that pair under similar operating conditions when the pair were known to be in their preferred orientation as at the initiation of their use.

Another feature includes selectively associating a resistance measuring means for a Joule effect electrode pair with a plurality of such electrode pairs and an incipient failure indicator or an electrode slump indicator and an electrode pair indicator to identify the pair of the plurality for which the indicator is operated.

BRIEF DESCRIPTION OF THE DRAWINGS

FIG. 1 is a flow diagram of a precedure for monitoring for incipient electrode failure in a Joule effect heater for conductive heat softenable material;

FIG. 2 is a schematic representation of the plan of a glass melter having electrode pairs made up of individual electrode elements and having an electrode pair made up of electrodes having plural elements and the monitoring schematic wiring diagram for a typical pair of each type;

Figure 3:
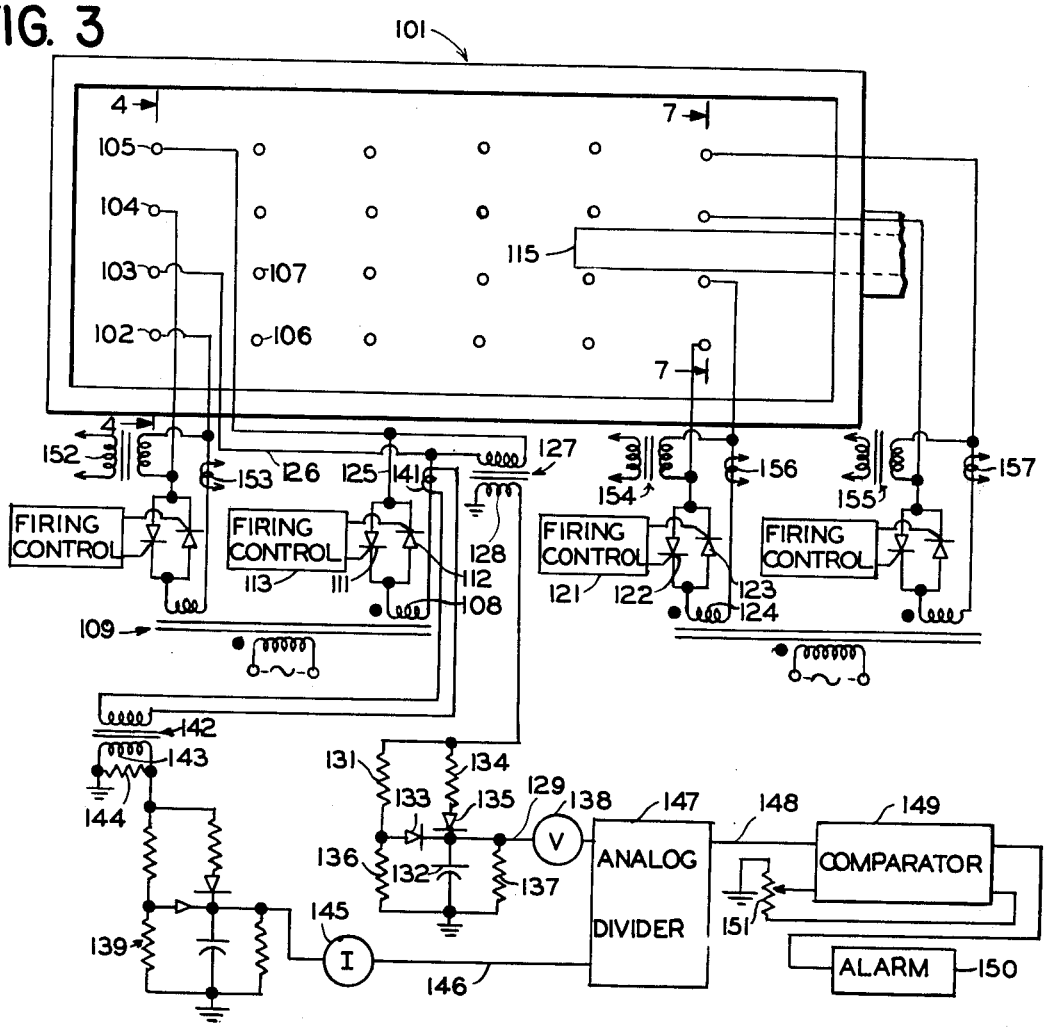
FIG. 3 is a schematic and block diagram of an alternative monitoring circuit for a typical electrode pair wherein voltages representing approximate r.m.s. values of current and voltage applied to an electrode pair for Joule effect heating of material in the vicinity of those electrodes is monitored as a ratio compared to a set point value to ascertain either short term deviations in the ratio or deviations from an actual or extraplated original ratio for long term deviations.

DESCRIPTION OF THE PREFERRED EMBODIMENTS in accordance with the present invention it has been discovered that incipient failure of an electrode immersed in a fluid mass of heat softenable material to which it communicates electrical current for Joule effect heating is indicated by an increase in the resistance between electrode pairs carrying such current. This phenomena is believed due to erosion of the electrode to reduce its cross section and to the development of fractures in the necked down region of erosion Since a significant increase in resistance between electrode pairs has been observed as much as 24 hours in advance of an electrode failure, it has been deduced that the onset of the process ultimately resulting in failure is a decrease in cross sectional area along the electrode length. This decrease or necking down has most frequently been observed in the region of the electrode in the vicinity of its emersion from the refractory wall of the container for the molten material. Characteristically, the rate of increase of resistance increases with time. It has been found that a 20% increase is a reliable indicator of incipient trouble, hence such an increase has been employed as the criterion for actuating a trouble indicator.

It should be recognized that in long term campaigns of t.e Joule effect heated container some erosion of electrodes will be experienced over relatively long intervals. This long term erosion and the attendant long term increase in resistance between electrode pairs is not indicative of incipient electrode failure. Accordingly in the case of a glass melter for sodium-boro-silicate type glasses for the production of glass wool heated to a melting and refining temperature of about 2600° F. the resistance between vertical, right circular, cylindrical, molybdenum electrodes of 3 inches diameter extending through the furnace bottom and contacting the glass over about 40 inches of length is about 0.04 ohms when spaced 6 feet apart across the bottom.

A sensed increase of resistance to 0.05 ohms over a relatively short interval has been employed to indicate incipient failure. In order to minimize false indications the period of operation for which normal erosion resistance changes are not compensated has been about 3 months. Thus where resistance between electrode pairs is compared against a set point value that set point can be reset at twenty percent in excess of the the current resistance every 3 months.

Operation of an indicator according to this system can be employed to effect an automatic shutdown of power to the electrode pair at which the increased resistance is sensed. However, a preferred practice is to operate an alarm continuously until the alarm is acknowledged and to instruct responsible personnel to respond to the alarm by inspection of the electrodes, their circuits and the furnace to ascertain the cause of the change and either repair that cause, shut down power to the region in question or assure themselves that no problem exists.

A number of variables which influence electrode pair resistance exist for any given system to which the above method of monitoring is applied. In the case of glass a steep temperature coefficient of resistance exists in the range of temperatures of interest for melting, refining and working. Composition of the glass is also significant in determining resistance. Electrode size and condition as mentioned above also has an effect on resistance. In normal practice glass composition and temperature are stabilized and therefore can be disregarded. Alternatively, other means of sensing changes in conductivity due to changes in temperature or composition are available to indicate invalidity of a deviation in resistance or ratio attributable to these factors and to enable adjustments to be made by extrapolation to compensate the set points for these changes. The initial electrode size is predetermined and the gradual change in size can be accommodated as it alters electrode pair resistance as outlined above. Thus a relatively abrupt change of electrode pair resistance can be correlated with abrupt changes in electrode condition.

In practice Joule effect heating of glass is accomplished with a plurality of electrode pairs. The electrodes of these pairs can be made up of single or multiple elements. Effective monitoring of the system involves selectively monitoring the resistance of each of a plurality of electrode pairs. This is accomplished by scanning the pairs in a cyclical sequence. Where plural elements are employed for an electrode of a pair, the individual electrode elements can be scanned when paired with another electrode or electrode element. This element monitoring is desirable since the increase in resistance due to a change in an element's condition is masked by its parallel connected elements. Such parallel connected electrode elements tend to pick-up the current formerly carried by an associated element as that element deteriorates and increases its resistance.

Another factor which should be considered in monitoring electrode pair resistance is the interpair current flow and the complex waveshape of furnace input power from which the current and voltage values for indicating resistance are derived. The interpair current flow can be disregarded in a stable system. The waveshapes, particularly those developed by phase or time proportioned control of applied power deviate from pure sine form. Signals representing voltage and current can be processed to be true r.m.s. values for accurate electrode pair resistance determination. This is particularly true in the case of Joule effect heating of glass where essentially the entire impedance is resistive.

Where computer computation of resistance is involved the true r.m.s. values of current and voltage can be scaled to fit the computers input requirements.

As represented in FIG. 1 monitoring for incipient electrode failure can be accomplished by developing a resistance value of an electrode pair including the electrode and by comparing that resistance with a set point which when matched actuates a failure responsive mechanism. Resistance is developed by ascertaining the voltage or a scaled portion thereof, applied across the electrode pair of Joule effect heating of the molten material being processed and ascertaining the current, or a scaled portion thereof, passed through the electrode air. This voltage and current monitoring can be undertaken at the cables or conductors leading to the electrodes.

The illustrated comparison with a set point is convenient for automatic operation of an indicator, print out mechanism or process control change, however, even a direct indicator reading of a predetermined value of resistance can be employed as an incipient failure indication.

Apparatus for Joule effect heating of molten glass is shown in FIG. 2 with a multiple electrode pair monitor operated through automatic scanning, resistance value development, and indication of alarm levels, current values and voltage values for a code identified pair. A glass furnace 11 is shown with five electrode pairs 12, 13, 14, 15 and 16 projecting upwardly through its bottom 17 and immersed in molten glass 18. Each electrode of pair 16 has two electrode elements 21, 22 annd 23, 24. Resistance monitoring is provided for pairs 12 through 15 and paired-electrode elements 21, 22 and 23, 24.

Each of electrode pairs 12 through 16 is coupled to a source of electrical power pulses of alternate opposite polarity as thraugh parallel, oppositely poled SCRs 26 and 27 for pair 12 controlled by a firing control 28 which can be provided with current limiting means (not shown) for selective firing of the SCRs as alternating current is applied through power transformer 29. In the case of electrode pair 12, leads 31 and 32 convey the power to the electrodes. In the case of electrode pair 16, the electrode elements are connected to the source of alternating current power from secondary of transformer 33 through SCRs 34 and 35 having firing control 36 corresponding to 28. Parallel leads 37, 38 and 41, 42 respectively extend to electrode elements 21, 22 and 23, 24. Controlled sources of power pulsations of opposite polarity (not shown) corresponding to the transformer 29, SCRs 26 and 27 and firing control 28 are provided for electrode pairs 13, 14 and 15.

Resistance for electrode pair 12 is ascertained by sensing voltage across the electrodes at leads 31 and 32 by means of transformer 44 having one side of its secondary grounded and the other side connected through lead 45 and contact 46 of relay R1 to bus 47. Bus 47 applies the voltage waveform to true r.m.s. to d-c coverter 48, typically a 4128 ture r.m.s. to d-c converter by Burr Brown.

The d-c scaled signal representing r.m.s. voltage is applied to computer 51 by leads 52 and 53 from converter 48 and processed in the computer with a scaled signal representing r.m.s. current to develop a resistance value for the electrode pair 12. Current supplied electrode pair 12 from the power source for Joule effect heating of the molten material 18 is sensed by current transformer 54 having windings around lead 32, which feeds a signal to transformer 55. In the scaling of the current signal, a resistor 56 is connected across the secondary of transformer 55 between its grounded end and lead 57 which passes the signal through contact 58 of relay R1 to the bus 59 connected to true r.m.s. to d.c. converter 61 corresponding to converter 48. The scaled d.c. signal representing r.m.s. current is passed by leads 62 and 63 to computer 51 for processing to a resistance value. The normal resistance value for an electrode pair can be established by calculation or by measurement.

When equilibrium processing conditions have been established in furnace 11, a resistance value can be developed by the computer from the ascertained r.m.s. voltage and r.m.s. current values. A set point is then established as an alarm threshold and set as one input value to a comparator internal of the computer. The other input to the comparator is the processed resistance value ($R = E/I$) derived from the r.m.s. voltage and r.m.s. current.

The converter functions of 48 and 61 and the processing functions of the computer 51 are employed for a plurality of electrode pairs where plural pairs are to be monitored. This is done on a time sharing or multiplexing basis as scheduled internally of the computer annd the computer periodically issues an address code for the several circuits for which resistance is to be monitored. Typically an IBM 1800 computer employed for a number of other process monitoring and control functions is employed so that it is connected by multiplexing circuitry to the electrode pairs in succession. In the scan each electrode pair, evaluation typically involves an interval of about two seconds. Within this two second interval a r.m.s. voltage and r.m.s. current are read and a resistance calculation made. A coded output is then issued so that the multiplexing circuitry is connected to a next circuit to be evaluated. The computer can be arranged for continuous recycling of the scan of circuits subject to evaluation, for time spaced complete cycles of the scan, or for selective evaluation of cetain circuits at more frequent intervals than for other circuits.

The circuit address codes are issued by computer 51 in four binary signals on leads 64, 65, 66 and 67 to decoder 68. Decoder 68 issues individual relay actuating signals to relays respectively having normally open contacts in their circuits between the voltage signal source and the r.m.s. converter 48 for voltage signals and the current signal source and the r.m.s. converter 61 for the electrode pair of the respective code. Thus relay R1 is energized to close contacts 46 and 58 and couple electrode pair 12 for resistance computation. In the same manner other pairs of electrodes are monitored by energizing relays in scan sequence. While the pair code is issued by computer 51, it also issues a pair code which can be digital or translated to another code such as a number letter to the display 71 as at window 72 while current and voltage values are displayed at windows 73 and 74.

In the event of a resistance level which is excessive for the zone under surveillance at the time, an alarm indicator can be displayed as at window 75 and/or a typewriter print out or CRT display can be arranged to issue a message such as "electrode pair 1, turn off power and call supervisor."

Since the resistance between electrode pairs or electrode element pairs can be different, each pair can be provided with a separate set point. This set point is called out of the memory of computer 51 at the time that pair is under surveillance. It can be offset appropriately (as at 120% of normal resistance) for the alarm threshold for indicating an electrode failure in the pair.

It will be noted that while the fifth pair 16 of electrodes or the fifth Joule effect heating zone as numbered from left to right in FIG. 2 has two elements in the form of closely spaced right-circular cylindrical rods extending vertically upward through the furnace bottom, the electrode elements are paired to enable monitoring of individual elements. Thus while a common source of power for Joule effect heating of zone 5 is coupled to the individual elements in electrical parallel, only one such element of each polarity is monitored in a scan interval. Elements 21 and 23 are monitored for their voltage at transformer 76 across leads 37 and 41 and their current at winding 77 in lead 37 to transformer 78. This monitoring is effective when addressed so that decoder 68 energizes relay R5 exclusively and closes contact 81 to the true r.m.s. converter 48 for voltage and contact 82 to the true r.m.s. converter 61 for current. At this time the computer calls up the set point resistance value across this pair of electrode elements and actuates the display. Further, a separate scan interval is provided for the pair of electrode elements 22, 24 of zone 5 when the computer sequences the address to energize relay R6.

Programming of the computer 51 can include an incipient electrode failure alarm subroutine. Such a subroutine holds the display in response to an alarm condition actuated in response to a resistance at the alarm threshold level. In this manner the electrode pair code of the pair indicating the alarm condition and the current and voltage sensed are held in display. Alternatively the computer can hold the address of the electrode pair indicating the alarm condition whereby the changes in current and voltage are displayed at 73 and 74 as they change subsequent to the onset of the alarm condition.

In addition to the relatively short term resistance changes discussed above, it has been found that long term resistance changes between Joule effect electrodes employed in heating heat softenable materials are also significant in indicating the condition of the apparatus for melting and refining the material and in enabling the life of apparatus to be extended. More particularly, changes in resistance or current-voltage relationships between electrodes paired as the principal source of current for heating a zone of material between them and in which they are immersed from the initial values observed when the electrodes are first placed in operation to values deviating at least 15 percent and up to 50 percent from the initial values indicate electrode displacement when those changes occur as long term effects, e.g. over periods of at least weeks and more frequently months or even years.

Vertically mounted electrodes upstanding in a body of molten glass will alter their paired electrode resistance as they slump from the vertical orientation from their initial value as a gradual change which over a long period will amount to increases and/or decreases from 15 to 50 percent as opposed to the relatively abrupt change discussed above. These long term changes are therefore measured against the initial values rather than the periodically reset set points employed to detect incipient electrode failure.

In the system of FIG. 2 electrode slumping can be monitored by comparing present values of resistance or current voltage ratio with the original value of zone resistance of resistance between paired electrodes and when that change is observed to be gradual, over a period of at least weeks, and is in excess of 15 percent of the original value to actuate an indicator. Thus a subroutine to scan and process present resistance values between paired electrodes with initial values between those same electrodes can be employed to actuate computer 51 and its associated claim 75, current value indicator 74, voltage value indicator 73 and pair indicator 72.

Electrode slump indication has been found to be significant in regard to the direction of slump where interpair electrical parameter changes are available for more than one electrode in the region in which a slumped electrode is indicated. Slumping of one electrode has been found to affect the current-voltage ratios of adjacent electrode pairs especially where certain phase relationships exist between the power supplied the various electrode pairs.

As shown in FIG. 3 the plan pattern of electrodes in a typical tank 101 typically is six ranks of four electrodes each spaced generally evenly along the longitudinal axis of the rectangular tank. More particularly the electrodes are arranged to be energized in working pairs either as adjacent electrodes 116 and 117 in a rank, or alternate or interleaved paired electrodes 102 and 104, and 103 and 105 in a rank, and pairs in different ranks either parallel to the tank longitudinal axis as 102 and 106 or skewed to that axis as 102 and 107. A frequently employed arrangement is that shown in FIG. 3 where the principal currents are between alternate or interleaved electrodes across a rank as shown by the power supplied from the secondary 108 of transformer 109 through back-to-back controlled rectifiers 111 and 112 subject to firing control 113 applied to their gate electrodes. In a typical interleaved firing control for a tank supplied with polyphase power the electrodes of a rank are connected to a common phase and successive ranks of electrodes are connected to different phases. However, where interrank connections are made for the supplying transformers and controlled rectifiers, as between paired electrodes 102 and 106 in the suggested alternate, this common phase per rank is not the case. Further, as shown in the electrode connections adjacent the submerged throat 114 and bottom channel 115, adjacent electrodes may be coupled through their principal power supplies from a common phase as paired electrodes 116 and 117 and paired electrodes 118 and 119.

Adjacent paired electrodes 116 and 117 and 118 and 119 are supplied and controlled in the manner of typical electrode pair 103–105 as by means of a phase controlled firing circuit 121 for back-to-back controlled rectifiers 122 and 123 connected in series with a transformer secondary 124.

Resistance change as represented as a change in the ratio of the current to voltage imposed on the heat softenable material through the electrodes for Joule effect heating of that material can be ascertained by a number of techniques. As discussed with respect to FIGS. 1 and 2, the waveform resulting from phase controlled firing of controlled rectifiers resistance is most accurately indicated as a ratio of current to voltage from the root means square values of those quantities in view of the waveform distortions introduced by the phase controlled firing of the controlled rectifiers in the power source circuits to the Joule effect electrodes and the interphase currents within the mass of heat softened material. however, the impedance of the circuits for Joule effect heating is primarily resistive hence other current and voltage values can be employed, particularly where it is the change in their ratio which is significant. Thus the instantaneous values might be taken after firing of the controlled rectifiers, or the maximum values, or the average values could be employed. While a preferred measurement of voltage and current is through r.m.s. converters, as converters 48 and 61 of FIG. 2, for the purposes of ascertaining resistance changes in the sense of changes in the ratio of current-to-voltage alternative means can be employed.

Advantageously, these alternative value sensing means should indicate signal values which approximate r.m.s. values since those values can then be employed in other measurements than the change in ratio to be monitored for the present evaluation and detection method. One type of circuit which affords a close proportionality to r.m.s. values is the network shown in FIG. 3 employed for the sensing of current and voltage. It comprises a voltage divider which develops voltage across a resistor-capacitor combination which is closely proportional to the true r.m.s. values. A similar circuit is employed for each of the current and voltage sensing circuits or scanning means such as decoder 68 of FIG. 2 shifts the voltage and current sensing circuits between different electrode pairs as indicated by relays R1 . . . R6.

Voltage is picked up across the leads 125 and 126 to electrodes 103 and 105 by means of transformer 127 having a secondary 128 connected between ground and the r.m.s. proportioning circuit. The simulating circuit comprises a dual time constant charging cicuit which develops a signal at lead 129 which results from a sum of the signals representing time constants of resistor 131 and capacitor 132 through diode 133 and resistor 134 and capacitor 132 through diode 135 which the currents are divided in accordance with the values of resistors 131, 136, 134 and 137. In one example, resistance values of 390 ohms for resistor 131, 1000 ohms for resistor 136, 560 ohms for resistor 134 and 300 ohms for resistor 137 were employed with a 20 microfarad capacitor 132 to produce an output on lead 129 which closely approximated voltage values having a constant proportionality to the actual r.m.s. voltage values across leads 125 and 126. By proper calibration of voltmeter 138 a direct reading of the voltage across the electrodes is provided.

Current sensing signals proportional to r.m.s. current can be achieved in a circuit 139 from a signal picked up by a current coil 141 associated with a lead to the Joule effect electrodes, as lead 126, through transformer 142 having one end of its secondary 143 grounded and a resistance 144 connected across its secondary. An ammeter 145 is calibrated to indicate the proportioned r.m.s. current on output lead 146.

A resistance value or ratio of current to voltage is derived from analog divider 147 to which the current and voltage signals are applied from leads 146 and 129 so that an output signal on lead 148 is passed to a comparator 149. A set point potentiometer 151 is associated with the comparator to enable the establishment of standard values against which the ratio signal is compared. When that standard is reached by the output signal on 148 an alarm 150 is actuated.

The system can be arranged to scan a plurality or all of the electrode pairs as by relay selector system of the type shown in FIG. 2 and can be provided with a visual indicator (not shown) to identify the out of range pair. The visual indicator in one form is a lamp array with a lock up control for holding the indication of an out of limits pair even as scanning is continued. A manual override of the scanning (not shown) is employed to set the selection of the electrode pair for which the alarm was actuated.

It is advantageous to employ the same proportioning circuits for each electrode pair to avoid variations in values indicated due to variations between circuits. Where different resistance standard values are to be monitored as where the electrodes are immersed in portions of the tank 101 having different temperature characteristics the set point for comparator 149 are different for the different base resistance values from which the given deviation is to be effective. One means for shifting set points with the scan of the electrode pairs is by switching to various tap positions (not shown) on potentiometer 151. This can be done by switching to separate taps each having an appropriate setting by means not shown or by switching to separate potentiometers each having its appropriate setting (by means not shown).

The simplified proportioning circuits while providing a truer indication of the current-voltage ratio or resistance for the range of values derived from a phase controlled firing at different phase settings than for averaging circuits is less accurate over the range phase angle setting than a true r.m.s. converter as shown in FIG. 2. However, it is sufficiently accurate to detect deviations within a few percent of true r.m.s. values and thus to enable the monitoring features of the invention to be realized for short term changes indicative of incipient failure attributed to internal fracturing of an electrode or necking down of an electrode prior to a break off of the electrode top. Long term resistance changes which indicate electrode slumping can also be sensed by these circuits, and in such instances since the reference value of the ratio or resistance is that originally obtained at the start up of the tank compaign or mounting of the electrode pair in question, no need to reset set points is required after the limiting signal deviations have been established for the comparator 149.

A correlation between long term resistance changes and the displacement of electrodes within the heat softenable mass has been observed. In certain glass melting tanks some Joule effect electrodes which were installed extending vertically through the tank bottom have slumped toward or to the bottom of the tank thereby changing the operating parameters of the system.

Molten glass in a cold top Joule effect melting operation exhibits a thermal gradient through the depth of the batch cover, the batch molten glass interface and the depth of the molten glass. Glass at the glass-tank bottom interface is hundreds of derees cooler than that at and near the top of the Joule effect electrodes. In view of the steep negative temperature coefficient of resistance of molten glass, the slumping of an electrode tends to orient it in higher resistivity material. Countering this effect is the presence of the electrode and thus the Joule effect heating of the glass, which is most intense in the immediate vicinity of the electrodes, tends to concentrate around the elctrode and, to the extent it is not inhibited by the higher resistivity of the cooler molten glass, tends the heat the glass adjacent the bottom of the tank. Volumetric effect must also be considered where one or both of two paired electrodes have slumped in the change of resistance of the circuit including paired Joule effect electrodes and the intervening molten glass, since as the electrode approaches the tank bottom it tends to lose its radial flux paths into the cylinder of the molten glass mass around the electrode and to have only the volume of molten glass above them in which to conduct current. In effect the volume through which current is effectively conducted is reduced by the proximity of the slumped electrode to the furnace bottom.

It is desirable in the Joule effect heating of glass to detect the slumping or displacement of electrodes from their preferred orientation because that slumping disrupts the thermal patterns in the molten glass and thus the melting and refining parameters. Further, the refractory employed in the walls of glass tanks erodes at a relatively high rate when subjected to electrical potentials which cause current to flow therein. As an electrode slumps toward the bottom wall the rate of both thermal and electrical erosion of that wall increases substantially, even to the degree of puncturing the wall and thus prematurely ending the campaign of the tank. Early detection of electrode slumping enables the tank attendants to take corrective measures which maintain processing parameters and extend the useful life of the equipment. Typically, the slumped electrode can be removed from the operation of the tank as by disconnecting it from its source of electrical power or replacing it by pushing it through the furnace bottom in advance of a replacement electrode without interruption of tank operation. In certain instances the slumping can be accommodated by a reconnection of the electrodes and their power supplies. Accordingly, it is desirable to ascertain the nature of the slumping.

FIG. 4 through 8 illustrate various slumping patterns for which resistance change characteristics have been measured and various connections of sources of power, represented by the dashed lines between electrode pairs. FIGS. 4, 5, 6 and 8 represent interleaved firing across the section 4—4 of FIG. 3 such that the dashed lines 152 and 153 represent the connection of the controlled sources of Joule effect heating power supplied to electrode pairs 105-103 and 104-102 respectively. The molten glass-to-tank floor interface is represented as line 154 and the cross sections are drawn as having the molten glass depth greater than the height of upstanding electrodes 104 and 102 of FIG. 4 from the interface 154.

Figure 4:
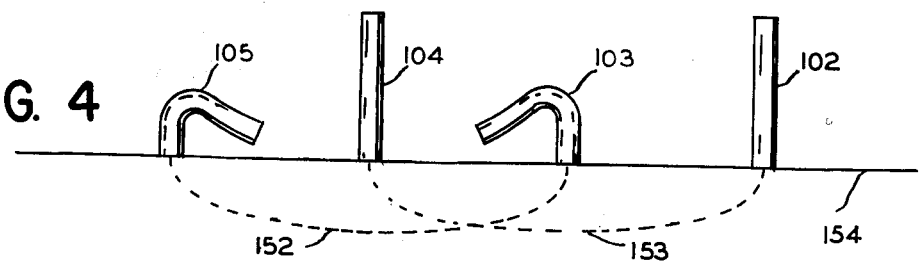
FIGS. 4, 5, 6, 7 and 8 represent variants of the connection of electrodes and the slumping patterns for those electrodes for which resistance models have been developed to aid in the evaluation of observed resistance changes taken from a fragmentary cross section of FIG. 3 at lines 4—4 for FIGS. 4, 5, 6 and 8 and at line 7—7 for FIG. 7.

When a pair of firing electrodes in an interleaved firing rank slump toward each other as in FIG. 4 electrode pair 105-103, the resistance of the zone between those electrodes will increase. If the electrodes slump rapidly, that is in a period of hours as opposed to the more usual weeks or months, the resistance will increase about 30%. This is attributed to the thermal inertia of the molten glass mass. The greatest current density and greatest Joule effect heating occurs in a thin sheath of the glass around the electrodes. In the case of 3 inch diameter molybdum electrodes a preponderance of the energy dissipation occurs within a sheath of a wall thickness of about 3 electrode diameters with most dissipation occurring in the hotter material above the tank bottom. It is theorized that when an electrode slumps rapidly it tends to slump out of its high temperature sheath and thereby be partially or totally surrounded with cooler glass of higher resistivity which increases the resistance of the glass between the electrodes.

In those instances where the electrodes of FIG. 4 slump toward each other slowly, an increase of about 20% will be observed in the resistance between the slumped electrodes. However, when the other pair of electrodes 104-102 remains in its preferred orientation, vertical, the resistance between them will decrease by about 25%. This decrease is attributed to reduction of the effective length-to-area of current flux lines between the electrodes since the opposing electrical poles of the slumped pair are removed from the major conduction region.

Figure 5:
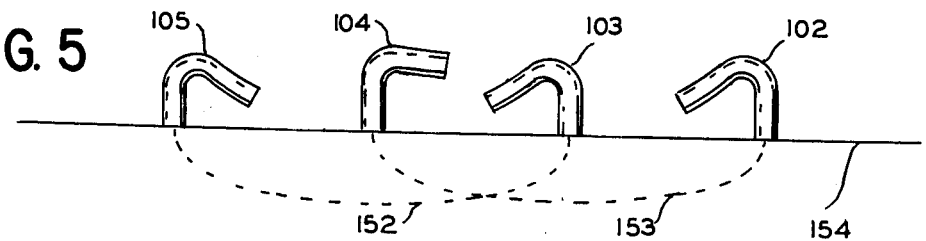

Another electrode slumping pattern is illustrated in FIG. 5 where the electrodes of both of the electrode pairs 105-103 and 104-102 slump toward each other. In a sequential slumping of the pairs, when the second to slump pair of electrodes slumps toward each other its zone resistance increases from the initial value by about 15% and the first to slump pair has its zone resistance decreased by about 5% to about 15% of its initial value, that is it decreases from its initial 20% increase relative to its initial reference value by 5% of that initial reference value.

In FIg. 5 electrodes 104 and 103 are represented to have slumped toward each other without contacting each other. It is to be recognized that slumping of electrodes can occur in any direction and that the examples showing slumping in the general plane of a cross section have been chosen for convenience of illustration and discussion. Where electrodes 104 and 103 slump into actual or near engagement with each other and are effectively electrically connected by a low resistance path, as illustrated in FIG. 3, they connect the secondaries of their supply transformers in series aiding across the outer electrodes 102 and 105 and the preponderant current path will be across the outer electrodes 105 and 102. The resistance of each of the two zones will decrease significantly to of the order of one-half their initial values.

Figure 6:
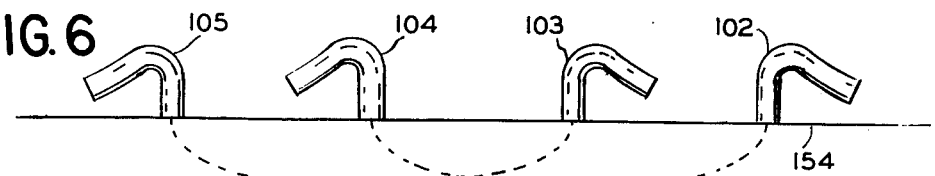

If a pair of electrodes slumps in opposite directions, away from each other, as shown for the elctrodes of FIG. 6 the resistance of each zone increases about 33% above the initial zone resistance. This is attributable to the greater effective electrode spacing in the molten glass, the location of the electrodes in a cooler portion of the melt, and the volumetric effect of the reduced area for effective conduction in the melt due to the proximity of the refractory floor to the slumped electrodes. Little effect on the zone resistance of an adjacent zone in the rank when the second to slump pair slump away from each other, as its resistance also increases about 33% from its original value. It is believed that the slumping of the first pair to slump away from each other has little effect on the resistance of the zone of the pair which remains in its vertical preferred orientation because like electrical polarities are close together as 105 to 104 and 103 to 102 negating the cell constant change in the melt.

Figure 7:
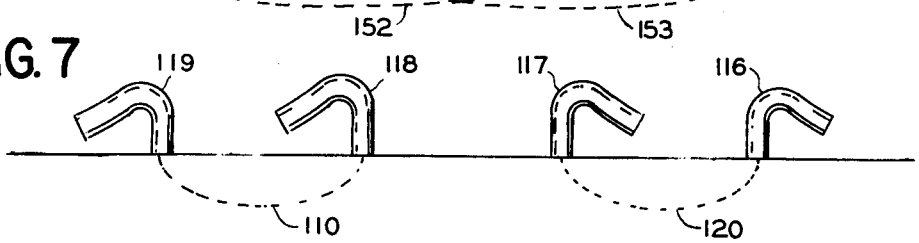
Figure 8:
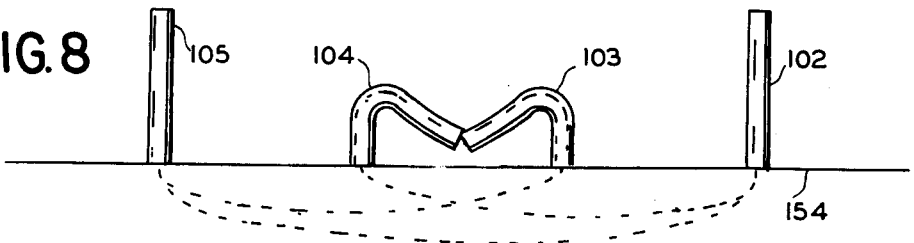

Outward slumping of electrode pairs connected for side-by-side electrode firing as illustrated for electrode pairs 116–117 and 118–119 supplied along dotted lines 110 and 120 in FIG. 7 has been observed to increase the zone resistance about 30% of its original resistance in the preferred electrode orientation. As in the case of paired electrodes 102 and 104 where only voltage sensing transformer 152 and current pick up coil 153 are shown for association with the r.m.s. approximating voltage and current circuits in a manner corresponding to transformer 127 and coil 141, the voltages and currents in the circuits to paired electrodes 116–117 and 118–119 are ascertained through transformers 154 and 155 and pick up coils 156 and 157 respectively for connection to the r.m.s. approximating circuits.

Figure 9:
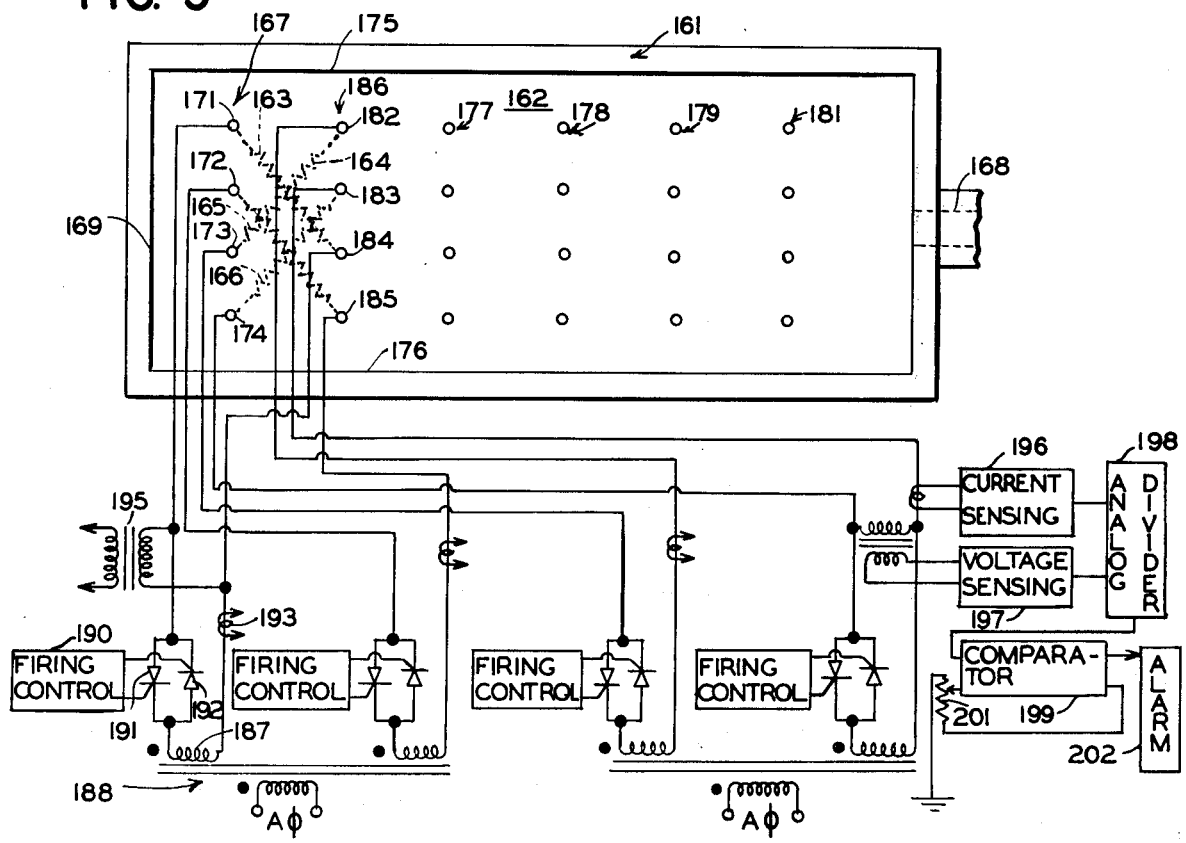
FIG. 9 is a schematic representation of a plan of a glass melter and typical electrode firing patterns which result in a relatively uniform resistance increase for any electrode slump direction.

An illustration of an electrode array and electrode firing pattern which exhibits uniform zone or paired electrode resistance changes as a result of electrode slumping in any direction is set forth in FIG. 9 The pattern is one of crossed zones which are diagonally oriented to the longitudinal axis of the tank 161 to provide relatively long principal conductive paths in the melt 162 contained by the tank. These long paths are represented by the dashed line resistances 163, 164, 165 and 166 and are dictated by the increased melt resistance sought at the working temperatures to enable the requisite amount of electrical power to be imposed on the limited volume of melt at a high voltage and lower current. This reduces losses in the power supplys, particularly the transformer and cable $I^2R$ losses.

A typical tank 161 is 41 feet long, 16 feet wide and provided with six ranks of four electrodes each. The rank 167 most remote from the submerged throat 168 is located four and one-half feet from back wall 169 and the rank-to-rank spacing is 6 feet. Electrodes are spaced across the tank in like manner in each rank as in rank 167 in which the outer electrodes 171 and 174 have their centers 3 feet from the respective proximate side walls 175 and 176 and the center-to-center spacing of electrodes along a rank is 3 and one third feet. The three inch diameter molybdenum electrodes 171 through 174 have about 40 inches exposed to glass, the melt 162, and in the illustrated array have about a 25 percent greater resistance in the diagonal zones represented as 163 through 166 than in the same geometry with interleaved electrode pair firing as disclosed in FIG. 3. It is theorized that this increased zone resistance increases the volume of the melt proximate to the electrodes in which the preponderance of the Joule effect heating occurs thereby reducing volumetric effects on the zone resistance change experienced when an electrode slumps. Further, the absence of electrodes of other pairs in the volume of melt between each electrode pair reduces the cell effect of displacement of such electrode on the change in resistance of the zone. In practice it has been found that a zone having a slumped electrode in a system of the type shown in FIG. 9 exhibits an increase over its initial condition with both electrodes vertical and upstanding from the bottom of tank 161 of about thirty percent for any direction of slumping.

As shown in FIG. 9 a single phase, phase A, of the power source is coupled across the first two ranks of electrodes with all the electrodes of each rank having like instantaneous polarities imposed at the supply transformer secondaries. Similarly another phase is individual to electrode ranks 177 and 178 and still another phase to electrode ranks 179 and 181. Power is supplied to each zone as previously described.

Zone 163 between electrode 171 of rank 167 and electrode 184 of rank 186 is supplied from secondary 187 of transformer 188 through back-to-back parallel connected controlled rectifiers 191 and 192 controlled by a firing control 193. Each zone is monitored for its electrical parameters as described above employing a current pick-up coil 194 on a cable to an electrode and a voltage sensing transformer 195 connected across the cables to the electrodes of a zone.

Current sensing means 196 and voltage sensing means 197 transpose the signals from current pick up coils, as 194, and voltage sensing transformers, as 195, respectively for application to analog divider which issues a ratio or resistance signal to comparator 199 all as previously described. The initial set point for the comparator 199 is established based upon the initial resistance of the associated electrode pair and its zone is set on potentiometer 201 and an alarm 202 responds to the preset deviation of resistance from the original value. Only a typical block diagram and the current pick up coils and voltage coils for the first bank of zones is illustrated. It is to be understood that scanning means for associating the block diagram elements for ascertaining resistance and limits thereon with each zone of the bank as well as other banks is contemplated as by the relay-decoder of FIG. 2 wherein only one ascetaining circuit is employed and that zone identification and set point association can be coordinated with the scan function by the decoder. Further, where desired, both increased and decreased resistances relative to original zone resistance values can be accommodated by the scanning sequence and set point selection means.

The magnitudes of the long term changes in zone resistance cause by the displacement of electrodes from the preferred orientation are a function of many factors apart the aforementioned direction of slumping, speed of slumping, slumping relationships between electrodes of a pair providing the principal zone current, and the slumping relationships or lack of slumping between electrodes of several pairs. Particularly significant effects upon the resistance change are the firing configuration of the electrodes, their relative instantaneous polarity and their phasing. However, in any arrangement a long term change in resistance of a zone in the range of about 15% to about 50% of the original zone resistance is indicative of the slumping of an electrode, the displacement of an electrode from its preferred orientation and in many instances the magnitude of the resistance change and the relationships of the changes in resistance in nearby electrode pair zones provides a rather precise indication of the nature and direction of the electrode displacement from the preferred orientation.

In view of the different electrode orientations in a Joule effect heating system for heat softenable material, and the numerous variations in individual and combined electrode displacement it is to be understood that this disclosure is merely illustrative of the invention and is not to be read in a limiting sense.

What is claimed is:

1. The method of monitoring the state of electrodes immersed in a mass of heat softenable material for Joule effect heating of the material which comprises ascertaining electrical parameters of the electrode and the material in proximity to the electrode when the electrode is initially utilized in the material; monitoring electrical parameters of the electrode and the material in proximity to the electrode during the useful life of the electrode; and ascertaining that the electrode has been displaced from its initial orientation in the mass as a function of the rate of change of the monitored electrical parameters and the magnitude of change of the monitored electrical parameters.

2. The method according to claim 1 wherein the electrical energy for Joule effect heating is applied through the electrode is applied as pulsations of alternately opposed polarity of a nonsinusodial waveform;

and the monitored parameters are current and voltage which at least approximate r.m.s. values.

3. The method according to claim 1 including the steps of ascertaining the resistance of the electrode and the material in proximity of the electrode when the electrode is initially utilized; ascertaining the resistance of the electrode and material in proximity to the electrode during the useful life of the electrode; and actuating an indicator to indicate electrode displacement when the magnitude of the change is at least 15 percent of the initially ascertained resistance over a long term interval of at least weeks of electrode utilization.

4. The method according to claim 3 wherein the resistance is ascertained between two electrodes initially immersed in a body of the heat softenable material and upstanding vertically therein and wherein a long term change in ascertained resistance over the initially ascertained resistance to actuate the indicator is indicative of the slumping of an electrode from its upstanding vertical orientation.

5. The method according to claim 4 wherein said indicator is responsive to an increase in ascertained resistance from the initially ascertained resistance.

6. The method according to claim 4 wherein said indicator is responsive to a decrease in ascertained resistance from the initially ascertained resistance.

7. The method according to claim 4 wherein the magnitude of the change in resistance indicating electrode displacement is between about 15 and 50 percent of the initially ascertained resistance.

8. The method according to claim 3 wherein the heat softenable material is heated in a tank having a longitudinal axis and a bottom; wherein the electrodes are mounted as vertical elongate conductors upstanding from the tank bottom, are arranged in ranks of at least two pairs of electrodes in each of a plurality of ranks arrayed transverse of the longitudinal axis of the tank; wherein the paired electrodes are interleaved to establish principal conductive paths between paired electrodes within the heat softenable material having at least one electrode of another pair between each electrode pair; and wherein a long term decrease in resistance between first paired electrodes from the initial resistance between those electrodes to actuate the indicator is indicative of the slumping of an electrode of another pair located between the first paired electrodes.

9. The method according to claim 3 wherein the heat softenable material is heated in a tank having a longitudinal axis and a bottom; wherein the electrodes are mounted as vertical elongate conductors upstanding from the tank bottom, are arranged in ranks of at least two pairs of electrodes in each of a plurality of ranks arrayed transverse of the longitudinal axis of the tank, wherein the paired electrodes are interleaved and the principal conductive path within the heat softenable material is between paired electrodes in a rank separated by an electrode in said rank; and wherein an increase in resistance over the initial resistance between first paired electrodes coupled with a decrease in resistance over the initial resistance between other paired electrodes in the rank of the first paired electrodes and including an electrode between said first paired electrodes is indicative of a slumping of the electrode of said first paired electrodes between said second mentioned pair.

10. The method according to claim 9 wherein the increase in resistance between the first paired electrodes is between twenty and thirty percent of the initial resistance between those electrodes and the decrease of resistance between the other paired electrodes is about 25 percent of the initial resistance between those electrodes.

11. The method according to claim 3 wherein the heat softenable material is heated in a tank having a longitudinal axis and a bottom, wherein the electrodes are mounted as vertical elongate conductors upstanding from the tank bottom, arranged in ranks of at least two pairs the electrodes of which are interleaved in each of a plurality of ranks arrayed transverse of the longitudinal axis of the tank; and wherein an increase in resistance over the initial resistance between paired electrodes of about fifteen percent over the initial resistance of those electrodes indicates a slumping of at least one of those electrodes of each pair toward its paired electrode.

12. The method according to claim 3 wherein the heat softenable material is heated in a tank having a longitudinal axis and a bottom, wherein the electrodes are mounted as vertical elongate conductors upstanding from the tank bottom arranged in ranks of at least two pairs the electrodes of which are interleaved in each of a plurality of ranks arrayed transverse of the longitudinal axis of the tank; wherein adjacent electrodes of different pairs are supplied with voltages of different polarities a preponderance of the time; and wherein a decrease in resistance between paired electrodes of interleaved pairs of the order of fifth percent of their respective initial resistance values is indicative of a slumping of the adjacent electrodes of different pairs into close proximity to each other.

13. The method according to claim 3 wherein an increase of resistance between an electrode pair of about 33 percent over the initial resistance between that pair is indicative of the slumping of the electrodes of that pair away from each other.

* * * * *